(12) United States Patent
Singh

(10) Patent No.: US 9,203,406 B2
(45) Date of Patent: Dec. 1, 2015

(54) IMPLEMENTATION METHOD FOR FAST NCL DATA PATH

(71) Applicant: Wave Semiconductor, Inc., Sunnyvale, CA (US)

(72) Inventor: Gajendra Prasad Singh, Sunnyvale, CA (US)

(73) Assignee: Wave Semiconductor, Inc., Campbell, CA (US)

( * ) Notice: Subject to any disclaimer, the term of this patent is extended or adjusted under 35 U.S.C. 154(b) by 263 days.

(21) Appl. No.: 13/894,072

(22) Filed: May 14, 2013

(65) Prior Publication Data

US 2013/0249594 A1   Sep. 26, 2013

Related U.S. Application Data

(63) Continuation-in-part of application No. 13/827,902, filed on Mar. 14, 2013, now Pat. No. 8,981,812, which is a continuation-in-part of application No. 13/772,759, filed on Feb. 21, 2013, now Pat. No. 9,024,655.

(60) Provisional application No. 61/646,653, filed on May 14, 2012, provisional application No. 61/610,559, filed on Mar. 14, 2012, provisional application No. 61/601,547, filed on Feb. 21, 2012.

(51) Int. Cl.
*H03K 19/094* (2006.01)
*H03K 19/00* (2006.01)
*G06F 9/38* (2006.01)

(52) U.S. Cl.
CPC .......... *H03K 19/0027* (2013.01); *G06F 9/3869* (2013.01)

(58) Field of Classification Search
None
See application file for complete search history.

(56) References Cited

U.S. PATENT DOCUMENTS

| 5,305,463 | A |   | 4/1994  | Fant et al.    |         |
|-----------|---|---|---------|----------------|---------|
| 5,355,496 | A |   | 10/1994 | Fant et al.    |         |
| 5,572,732 | A |   | 11/1996 | Fant et al.    |         |
| 5,640,105 | A |   | 6/1997  | Sobelman et al.|         |
| 5,652,902 | A | * | 7/1997  | Fant ...........| 235/61 PC |
| 5,656,948 | A |   | 8/1997  | Sobelman et al.|         |
| 5,664,211 | A |   | 9/1997  | Sobelman et al.|         |
| 5,664,212 | A |   | 9/1997  | Fant et al.    |         |
| 5,764,081 | A |   | 6/1998  | Fant et al.    |         |
| 5,793,662 | A |   | 8/1998  | Duncan et al.  |         |
| 5,796,962 | A | * | 8/1998  | Fant et al. .....| 710/100 |
| 5,805,461 | A |   | 9/1998  | Fant et al.    |         |
| 5,828,228 | A |   | 10/1998 | Fant et al.    |         |

(Continued)

OTHER PUBLICATIONS

"Glitch-Free Design for Multi-Threshold CMOS NCL Circuits", by Al Zahrani, et al., GLIVLSI'09, May 10-12, 2009, Boston, Massachusetts, Copyright 2009 ACM 978-1-60558-522-Feb. 9, 2005.

*Primary Examiner* — Alexander H Taningco
*Assistant Examiner* — Nelson Correa
(74) *Attorney, Agent, or Firm* — Adams Intellex, PLC

(57) ABSTRACT

An implementation method for a fast Null Convention Logic (NCL) data path includes a pipeline that is assembled from gates of various types of NCL. Self-ready flash NCL gates include a one-shot circuit to reset the gates to a null state and prepare the gates for the next wave of asserted data. In one embodiment, the one-shot circuit creates a flash pulse inside a gate in response to a change of a flash input line and ends the flash pulse in response to the gate output being reset to a null state. Conventional logic can be included in the data path as well.

20 Claims, 6 Drawing Sheets

(56) References Cited

U.S. PATENT DOCUMENTS

| | | | | |
|---|---|---|---|---|
| 5,896,541 | A | 4/1999 | Fant et al. | |
| 5,907,693 | A | 5/1999 | Fant et al. | |
| 5,930,522 | A | 7/1999 | Fant | |
| 5,977,663 | A | 11/1999 | Fant et al. | |
| 5,986,466 | A | 11/1999 | Sobelman et al. | |
| 6,020,754 | A | 2/2000 | Sobelman et al. | |
| 6,031,390 | A | 2/2000 | Fant et al. | |
| 6,043,674 | A * | 3/2000 | Sobelman | 326/35 |
| 6,052,770 | A | 4/2000 | Fant | |
| 6,128,678 | A | 10/2000 | Masteller | |
| 6,262,593 | B1 | 7/2001 | Sobelman et al. | |
| 6,275,841 | B1 | 8/2001 | Potter et al. | |
| 6,308,229 | B1 | 10/2001 | Masteller | |
| 6,313,660 | B1 | 11/2001 | Sobelman et al. | |
| 6,323,688 | B1 * | 11/2001 | Podlesny et al. | 326/98 |
| 6,327,607 | B1 | 12/2001 | Fant | |
| 6,333,640 | B1 | 12/2001 | Fant et al. | |
| 6,433,584 | B1 * | 8/2002 | Hatae | 326/80 |
| 6,526,542 | B2 | 2/2003 | Kondratyev | |
| 6,636,996 | B2 * | 10/2003 | Nowka | 714/727 |
| 6,900,658 | B1 | 5/2005 | Sobelman et al. | |
| 7,053,662 | B1 | 5/2006 | Silver et al. | |
| 7,478,222 | B2 | 1/2009 | Fant | |
| 7,930,517 | B2 | 4/2011 | Fant | |
| 7,977,972 | B2 * | 7/2011 | Di et al. | 326/46 |
| 8,020,145 | B2 | 9/2011 | Fant | |
| 8,026,741 | B2 | 9/2011 | Takayanagi | |
| 8,078,839 | B2 | 12/2011 | Fant | |
| 8,086,975 | B2 | 12/2011 | Shiring et al. | |
| 8,981,812 | B2 * | 3/2015 | Singh et al. | 326/36 |
| 9,024,655 | B2 * | 5/2015 | Singh | 326/36 |
| 2006/0233006 | A1 | 10/2006 | Fant | |
| 2009/0204788 | A1 | 8/2009 | Fant | |

* cited by examiner

IMPLEMENTATION METHOD FOR FAST NCL DATA PATH

RELATED APPLICATIONS

This application claims the benefit of U.S. provisional patent application "Implementation Method for Fast NCL Data Path" Ser. No. 61/646,653, filed May 14, 2012. This application is also a continuation-in-part of U.S. patent application "Self-Ready Flash Null Convention Logic" Ser. No. 13/827,902, filed Mar. 14, 2013 which claims the benefit of U.S. provisional patent application "Self-Ready Flash Null Convention Logic" Ser. No. 61/610,559, filed Mar. 14, 2012 and is also a continuation-in-part of U.S. patent application "Multi-Threshold Flash NCL Circuitry" Ser. No. 13/772,759, filed Feb. 21, 2013 which claims the benefit of U.S. provisional patent application "Multi-Threshold Flash NCL Circuitry" Ser. No. 61/601,547, filed Feb. 21, 2012. The foregoing applications are hereby incorporated by reference in their entirety.

FIELD OF ART

This application relates generally to logic circuitry architecture and more particularly to implementation of a fast NCL data path.

BACKGROUND

Advances in integrated circuit manufacturing technologies make possible electronic systems comprising tens or even hundreds of millions of active devices. In addition, increased numbers of interconnection layers provide for more signal wiring and more complex control schemes. Among other things, consumer demand for such systems has led to increased system performance, decreased device size, and greater feature sets. The direct result of system and technology improvements is ever-increasing design complexity. The design complexity drives engineering challenges with regard to circuit design, system implementation/control, chip fabrication, and the like. This complexity has, for example, driven greater scrutiny of the systems architectures, logic circuits, interconnection schemes, and control circuitry. As a result, new architectures, technologies, and circuit families have been developed which can take advantage of reduced total device count, smaller device sizes, and simplified wiring/control schemes. The various systems architectures provide certain benefits and costs while requiring careful design consideration.

The data path within a system is a critical architectural component of high-speed digital systems designed to process data. The implementation choice for the architecture of the data path directly impacts overall system performance. For example, creating a data path based on a pipelined architecture can boost performance by executing multiple tasks simultaneously. Also, the choices of the logic circuit families that make up the logic gates of a digital system may greatly influence system performance. Logic circuits fall into two broad categories, static circuits and dynamic circuits. While static circuits find many applications where signal integrity and system robustness are paramount design criteria, dynamic circuits find many applications where system performance and circuit density are paramount. Interest has been focused on circuit families that can drastically reduce the amount of required global clock and control signal interconnect. Research has focused on circuit families that do not require a clock signal, such as asynchronous or self-timed circuits, as such circuits have distinct advantages over their clocked counterparts because the need for external control signals is reduced or eliminated.

SUMMARY

Incorporating self-ready flash null convention logic (NCL) as part of a data path allows for higher performance in asynchronous logic. Self-ready flash NCL allows more flexibility in the timing between the flash resetting and the data assertion. A mixture of self-ready flash NCL and other types of NCL logic may be incorporated in the data path. The designer or logic synthesis routine may intermix the self-ready flash NCL with flash NCL, standard NCL, and other logic gates to implement a desired logic function.

Self-ready flash null convention logic (NCL) includes a one-shot circuit as a part of the reset-to-null circuitry of the gate. Depending on the embodiment, the one-shot may be any circuit that generates a pulse from a transition on an input line. The one-shot may include an input to terminate the pulse that is driven by the output of the flash NCL circuit.

A logical pipeline is disclosed comprising a plurality of gates wherein the gates are comprised of: a plurality of transistors wherein the plurality of transistors provide for logical evaluation; a plurality of input lines, each having an asserted state and a null state, connected to the gate; a flash input line, having a first state and a second state, connected to the gate; an output line, having an asserted output state and a null output state, connected to the gate; and a data path formed from the plurality of gates wherein at least one gate includes a one-shot circuit wherein the one-shot circuit has an input attached to the flash input line and the one-shot circuit is used by the at least one gate to set the output line of the gate into the null output state. The at least one gate with the one-shot circuit may comprise a self-ready flash null convention logic gate. The logical pipeline may further comprise a registration stage that provides information to the plurality of input lines for at least one of the plurality of gates. An output of the registration stage may be connected to one of the plurality of input lines for one of the plurality of gates, wherein the output of the registration stage has an asserted state and a null state. The logical pipeline may further comprise a completion-detection circuit connected to a plurality of output signal lines from the registration stage. An output from the completion-detection circuit may be connected to a previous registration stage. The previous registration stage may reset based on information from the completion-detection circuit. Outputs from the previous registration stage may be set to a null state when the previous registration stage resets. The logical pipeline may further comprise a flash null generation circuit connected to one or more outputs of the registration stage. The flash null generation circuit may be connected to the flash input line of a self-ready flash NCL gate. The flash null generation circuit may provide a signal that resets one or more gates from the plurality of gates. Outputs from the one or more gates may be set into a null state based on signal from the flash null generation circuit. The data path may include one or more gates which are reset without the use of the one-shot circuit. The one or more gates which are reset without the use of the one-shot circuit may be flash NCL gates. The one or more gates which are reset without the use of the one-shot circuit may be null convention logic gates. An output from a self-ready flash NCL gate may be an input to a standard NCL gate. An output from a self-ready flash NCL gate may be an input to a flash NCL gate. The one-shot circuit may be shared across multiple gates.

In embodiments, a computer implemented method for logic implementation may include: incorporating a plurality of gates wherein the gates are comprised of: a plurality of transistors wherein the plurality of transistors provide for logical evaluation; a plurality of input lines, each having an asserted state and a null state, connected to the gate; a flash input line, having a first state and a second state, connected to the gate; an output line, having an asserted output state and a null output state, connected to the gate; and connecting a data path formed from the plurality of gates wherein at least one gate includes a one-shot circuit wherein the one-shot circuit has an input attached to the flash input line and the one-shot circuit is used by the at least one gate to set the output line of the gate into the null output state. In some embodiments, a computer program product embodied in a non-transitory computer readable medium for logic implementation may comprise: code for including a plurality of gates wherein the gates are comprised of: a plurality of transistors wherein the plurality of transistors provide for logical evaluation; a plurality of input lines, each having an asserted state and a null state, connected to the gate; a flash input line, having a first state and a second state, connected to the gate; an output line, having an asserted output state and a null output state, connected to the gate; and code for connecting a data path formed from the plurality of gates wherein at least one gate includes a one-shot circuit wherein the one-shot circuit has an input attached to the flash input line and the one-shot circuit is used by the at least one gate to set the output line of the gate into the null output state. In embodiments, a computer system for logic implementation may comprise: a memory which stores instructions; one or more processors coupled to the memory wherein the one or more processors are configured to: include a plurality of gates wherein the gates are comprised of: a plurality of transistors wherein the plurality of transistors provide for logical evaluation; a plurality of input lines, each having an asserted state and a null state, connected to the gate; a flash input line, having a first state and a second state, connected to the gate; an output line, having an asserted output state and a null output state, connected to the gate; and connect a data path formed from the plurality of gates wherein at least one gate includes a one-shot circuit wherein the one-shot circuit has an input attached to the flash input line and the one-shot circuit is used by the at least one gate to set the output line of the gate into the null output state.

Various features, aspects, and advantages of various embodiments will become more apparent from the following further description.

BRIEF DESCRIPTION OF THE DRAWINGS

The following detailed description of certain embodiments may be understood by reference to the following figures wherein.

DETAILED DESCRIPTION

Figure 1:
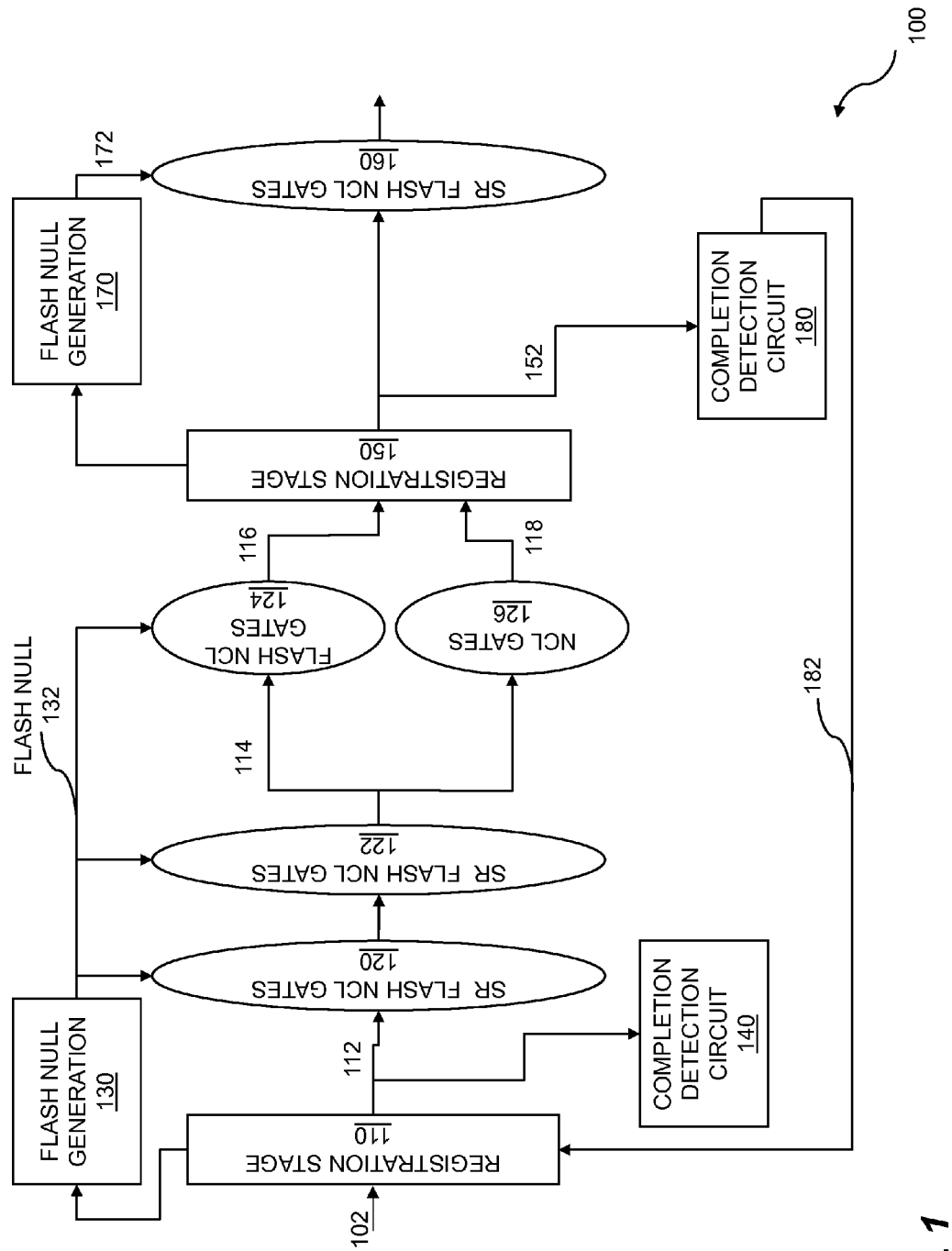
FIG. 1 is a block diagram of a fast NCL data path.

The present disclosure provides an implementation method for using fast Null Convention Logic (NCL) gates in a data path architecture. A pipelined data path increases overall system performance by executing multiple data tasks simultaneously. The data path pipeline is based on self-ready (SR) flash null convention logic (NCL) circuits, Flash NCL circuits, NCL circuits, and conventional logic circuits. Flash NCL circuits are different from standard NCL circuits in that they provide a direct mechanism for resetting the logic circuits instead of waiting for nulls to propagate through multiple circuit stages. The generation of a flash null signal may, however, present many design challenges. While Flash NCL gates provide for a faster data-null cycle, generation of a correct and in-time flash null signal may be difficult to generate properly within stringent delay specifications. The delay in flash null signal generation may cause a delay between the flash reset and "Go-to-Data" timing for a flash NCL logic gate. By including a one-shot circuit within the NCL gate to generate the timing signals for resetting the gate, these delays may be eliminated, providing for higher-performance NCL circuitry. Often, a typical flash null signal will include a much wider timing width than is absolutely needed in order to ensure that all of the NCL gates have been set into their null state. Timing delays are often included before the beginning and after the end of the flash null signal being active. By including the self-ready NCL flash circuitry, a proper flash null signal is generated inside the SR NCL gate; a signal that is sufficiently long enough for the gate to be set into the null state and ready the gate for the next asserted data to arrive. In this manner, the timing penalty often seen in null convention logic is avoided.

Flash NCL circuits are a class of asynchronous circuits described in U.S. Pat. No. 6,043,674 entitled "Null Convention Logic Gates with Flash, Set and Reset Capability," which is incorporated herein by reference in its entirety. Flash NCL may use a certain type of logic gate, referred to as a threshold gate, with a varying numbers of inputs and threshold values, where a threshold value is defined as a number of inputs being in an "on" state simultaneously.

An important aspect of NCL circuits is that any particular input line may have a meaningful (i.e. logic) value or a null value. In many embodiments, NCL logic includes two physical lines to provide a single signal—often referred to as dual-rail NCL. In such a dual-rail NCL technology, there are four possible states, a logical "one" value, a logical "zero" value, a "null" value, and an illegal value. The presence of a non-null or asserted value, i.e. a logical one value or a logical zero value, indicates that the state has meaning The illegal value should never occur within NCL circuitry. No external clock is required to indicate that valid (i.e. logic) evaluation is possible.

In one implementation, two physical lines may be used to convey an input line's state. For example, low voltage on the first physical line and high voltage on the second physical line may signal a "zero," or logic "false." Similarly, high voltage on the first physical line and low voltage on the second physical line may signal a "one," or logic "true." Low voltage levels on both lines may signal a null state. A high voltage level on both physical lines would be considered undefined and would not be used. Other embodiments of NCL logic may utilize multiple differing voltages on a single line to indicate null and asserted states. For example, an embodiment could use ground to indicate a null state, a "high" or positive voltage for a true state, and a "low" or negative voltage for a false state.

Self-ready flash NCL logic gates include circuitry which provides a pulse to a reset line to put the self-ready flash NCL logic gates into a null state. The circuitry used to generate the pulse may include a one-shot circuit. The one-shot circuit may be triggered by a flash line or a line derived from the flash line. The reset pulse may be terminated when it is detected that the output of a gate has been transitioned into a null state. In order to accomplish such a detection, the output of the gate may be fed as an input to the one-shot circuit.

In the context of the data path, signal timing on the flash null signal line may be accomplished by detecting completion of a given stage of logic gates. A stage of logic gates in the data path may conceptualized as the logic gates between two registration stages in the pipeline. That is, data flows or propagates from one registration stage through a stage of logic gates to a second registration stage. By examining the outputs of the second registration stage for any of a number of conditions or statuses of interest, a completion-detection signal may be generated. The completion-detection signal, which asserts only after all signals of interest have been captured by the second registration stage, may then be used to cause the flash null signal of the first registration stage to "flash"—reset—the SR flash NCL gates and the flash NCL gates. The non-flash NCL gates reset as nulls from the SR flash NCL gates, and/or the flash NCL gates propagate to the NCL gates.

The self-ready flash NCL may be implemented in CMOS logic using FET transistors. Field-effect transistors (FETs) are described as "on" and thus may conduct current, in the linear and saturated regions of operation. During the "off" state for the FET, the gate input voltage is below a threshold voltage (Vt) for the transistor. While this "off" state blocks the passage of current through the transistor, the transistor exhibits some current consumption even when "off." This consumption is termed sub-threshold leakage current. When in this state, the gate input voltage is below a threshold voltage for the transistor. Normally an N-type metal-oxide semiconductor (NMOS) field-effect transistor, also referred to as an NFET, is in the off state when its gate is at zero volts (ground) and the source of the NFET is also at ground. Normally a P-type metal-oxide semiconductor (PMOS) field-effect transistor, also referred to as a PFET, is in the off state when its gate is at the supply voltage (Vdd) and while the source of the PFET is also at Vdd. In some embodiments, high-Vt devices may be included in the self-ready flash NCL circuitry. In some cases, this circuitry could be considered multi-threshold null convention logic (NCL). Such logic includes one or more high-threshold voltage transistors (High Vt) within the NCL gate to reduce power consumption due to current leakage in the lower voltage threshold transistors of the NCL gate. Because the NCL gate may be built using high-speed transistors, the leakage current of the transistors may be significant, even when the circuit is quiescent (i.e. not switching). By including at least one high-Vt device with low leakage current in the current path, the leakage current of the NCL gate may be significantly reduced, thereby reducing the power consumption of the NCL gate. In some embodiments, the high-Vt transistors (also known as devices) may be added to the basic NCL gate structure, and/or high Vt transistors may be used in place of one or more lower-voltage threshold transistors of the basic NCL gate structure, in various embodiments. Under certain conditions the FET exhibits sub-threshold leakage. By using a higher-threshold FET device, current in the sub-threshold voltage regime is radically reduced.

FIG. 1 is a block diagram of a fast NCL data path 100. The pipeline 100 is a logical pipeline that includes a plurality of gates. The gates are comprised of a plurality of transistors that provide for logical evaluation, such as the logical evaluation of a pipeline, as shown later. The pipeline 100 includes a plurality of input lines connected to the gates. In many embodiments, an input signal is provided on a pair of metal lines where one of the pair can be asserted or both lines can be low, indicating a null state. The pipeline further includes flash input lines connected to the gates, the flash line having a first state and a second state, and output lines connected to the gates, the output lines each having an asserted state and a null state. In embodiments, the pipeline may be a data path formed from the plurality of gates where at least one gate includes a one-shot circuit. In embodiments, the one-shot circuit has an input attached to the flash input line and is used by at least one gate to set the output line of the gate into the low state. In embodiments, the logical pipeline may have at least one with a one-shot circuit, where the one gate with a one-shot circuit comprises a self-ready flash null convention logic gate.

A fast null convention logic (NCL) data path 100 may be constructed in a manner similar to data paths based in conventional NCL circuits, except that a flash null line 132 may be provided to the various flash NCL logic gates and SR flash NCL gates that are included in the data path 100. Nulls generated in the flash NCL logic gates and SR flash NCL gates propagate through and reset the conventional NCL logic gates. In some embodiments, self-ready NCL gates may be mixed with conventional NCL gates and/or flash NCL gates, so that the output line 114 of the self-ready NCL logic gate 122 drives an input of one of a Flash NCL gate 124, an NCL gate 126, and a Self-Ready Flash NCL gate. In other embodiments, self-ready NCL logic may be mixed with conventional combinatorial logic and/or synchronous logic blocks. The registration stage 110 may capture incoming lines 102 from a previous stage of the pipeline, and provide information to the plurality of input lines for at least one of the plurality of gates of the data path. The registration stage 110 may capture and save the inputs that have been asserted. In the data path shown, an output 112 of the registration stage 110 is connected to one of the plurality of input lines for one of the plurality of gates, where the output (or outputs) of the registration stage 112 has an asserted or null state. A completion-detection circuit 140 may detect that all inputs of the registration stage 110 have been received and may communicate with a previous stage of the pipeline (not shown). The input 102 (or inputs) to the registration stage 110 flows through the registration stage 110, through the cascaded SR flash NCL gates 120, and subsequently through downstream self-ready flash NCL gates 122. The outputs of the self-ready flash NCL gates 122 may then serve as the input of standard NCL gates 126. The outputs of the self-ready flash NCL gates 122 may further serve as inputs to flash NCL gates 124. The outputs of flash NCL gates 124, along with the NCL gates 126, then propagate assertions to a next registration stage 150. The outputs 116 of flash NCL gates 124 and outputs 118 of NCL gates 126 are fed to the next registration stage 150. The outputs 152 of the registration stage 150 may then flow to additional self-ready flash NCL gates 160 and on to other stages of gates in the data path pipeline (not shown). It should be noted that, in certain embodiments, a one-shot circuit for the SR flash NCL gates can be shared among multiple gates.

The inputs (116 and 118) to the next registration stage 150 may be organized into mutually exclusive assertion groups where only one of the lines of an assertion group may be asserted at a time, as in the case of dual-rail NCL. A completion-detection circuit 180 is connected to a plurality of output signal lines from the registration stage 150. The completion-detection circuit 180 may detect when one signal from each of the output groups 152 from the registration stage 150 has transitioned to an asserted state. The completion-detection circuit 180 may also detect when all of the outputs 152 have transitioned to a null state. The output 182 of the completion-detection circuit 180 is connected to the previous registration stage 110. The upstream registration circuit 110 may then reset based on information from the completion-detection circuit 180. In embodiments, by monitoring the assertion groups, the completion-detection circuit 180 may determine that each of the assertion groups asserts data (which means all the dual-rail pairs that are inputs to the completion-detection circuit have left the null state), indicating that the computation of the previous stage of SR flash NCL gates 120 and 122, flash NCL gates 124, and NCL gates 126 has completed. Once the completion-detection circuit 180 has detected that each assertion group has asserted data, the completion-detection circuit 180 may indicate that all inputs have been received at the next registration stage 150, and may then feed back a signal 182 to the previous registration stage 110 by triggering completion line 182. Thus, an output from the completion-detection circuit 180 may be connected to a previous registration stage 110. In response to the triggering of the completion line 182, the registration stage 110 may set its outputs 112 to a null state and communicate with the flash null signal generator 130 to generate a flash null 132 signal. The flash null generation block 130 may generate the flash null signal 132 based on the inputs 102 to the registration stage 110 being in a null state and based on the completion-detection circuit 180 detecting that the outputs 152 from the registration stage 150 have been asserted. The flash null generation circuit 130 (or, for example, 170) may be connected to one or more outputs of the registration stage 110 (or, for example, 150). In some embodiments, a one-shot component of the flash null generation circuit 130 may be shared across multiple gates. The flash null generation circuit provides a signal 132 that resets one or more gates from the plurality of gates. The flash null generation circuit 130 may be connected to the flash input signal line of a self-ready flash NCL gate such as the subsequent SR flash NCL gates 120. The flash null signal 132, created by flash null generator 130, may couple to the flash null inputs of the various SR flash NCL gates, 120 and 122, and the Flash NCL gates 124, to reset the NCL gates 126. Outputs from the one or more gates are set into a null state based on a flash null signal 132 from the flash null generation circuit 130. In some embodiments, the flash null generation circuit 130 and the completion-detection circuit 140 may be the same circuit block or may share significant amounts of circuitry.

In some embodiments, one or more gates are reset without the use of the flash null generation circuit 130. These gates, which are reset without the use of the flash null generation circuit, may be null convention logic gates (i.e. conventional NCL gates 126). Further, the data path 100 shown includes one or more gates which are reset without the use of the one-shot circuit. The one or more gates which are reset without the use of the one-shot circuit are null convention logic gates. The next registration stage 150 may receive an input from the following registration stage (not shown) and may use a flash null signal generation 170 circuit to generate a flash null signal 172 for its downstream SR flash NCL gates 160.

Figure 2:
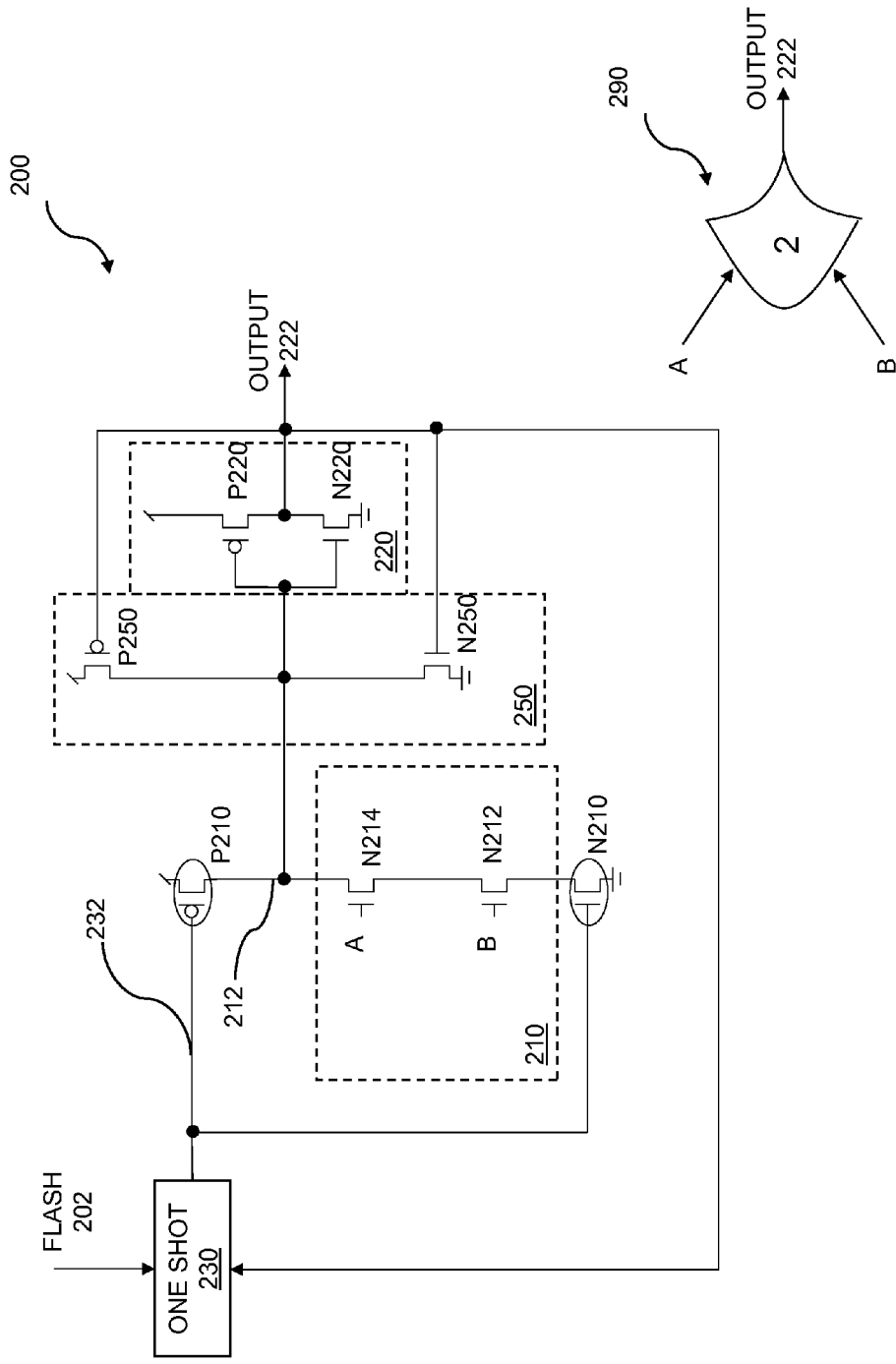
FIG. 2 is an example 2-of-2 self-ready flash NCL circuit with a one shot.

FIG. 2 is an example 2-of-2 flash NCL circuit 200 with a one shot 230. The circuit 200 is part of a logical pipeline where at least one gate with the one-shot circuit 230 comprises a self-ready flash null convention logic gate. An alternative representation of the circuit 200 is the gate symbol 290 with two inputs, 'A' and 'B' the numeral '2' inside the gate symbol, and a single output 222. The circuit 200 may include high voltage threshold field-effect transistors (high-threshold transistors). It should be noted that there are various ways of drawing schematic symbols for transistors throughout the industry. In the figures of this disclosure, an NFET with a low or standard voltage threshold is shown with the drain connected to the source by a solid line, and a separate line used for the gate with no surrounding oval, such as NFET N220. A PFET with a low or standard voltage threshold is shown with the drain connected to the source by a solid line, and a small circle on a separate line used for the gate with no surrounding oval, such as PFET P220. Transistors with a high threshold voltage or low leakage current are shown with a surrounding oval, so a high-voltage threshold, low-leakage NFET is shown with the drain connected to the source by a solid line with a separate line used for the gate inside a surrounding oval, such as high Vt N210. A PFET with a high voltage threshold and low leakage current is shown with the drain connected to the source by a solid line with small circle on a separate line used for the gate inside a surrounding oval, such as high Vt P210.

The actual threshold voltages and leakage currents of the high-Vt transistors and standard transistors may vary dramatically depending on the technology used. The voltage threshold of a standard transistor may range from several volts in some technologies to only millivolts (mV) in other technologies. The different parameters to change voltage threshold and/or leakage current for a transistor are well-known in the art, but may include thicker gate oxides, a different channel dopant density, different channel and/or gate geometry, or other differences in the ways that the transistors are fabricated. For the purposes of this disclosure, the terms low-leakage transistor, high voltage threshold transistor, high-Vt transistor, and high-threshold transistor may be thought of as synonyms and may be used interchangeably.

In circuit 200, the logical evaluation is performed by the 2-of-2 pull-down network 210 that includes NFET N212 and NFET N214 in series with an input A driving the gate of NFET N214 and an input B driving the gate of NFET N212. The circuit 200 includes a flash input line 202 coupled to a one-shot circuit 230 that may be used to reset the circuit 200 and set the output line 222 into the null output state. In the circuit 200, the one-shot 230 initiates a low voltage level pulse on the reset node 232 in response to the flash input line 202 transitioning. A low voltage level on the reset node 232 turns on the high-threshold transistor P210 and turns off the high-threshold transistor N210, which pulls logical evaluation node 212 high. A logical evaluation node 212 is fed into the output inverter 220 that is built from PFET P220 and NFET N220, so the output line 222 goes low, or to null.

Once the output line 222 is driven low, the one-shot 230 may terminate its output pulse by driving the reset node 232 high, in some embodiments. A high level on the reset node 232 turns high-threshold transistor P210 off and high-threshold transistor N210 on, allowing the 2-of-2 pull-down network 210 to perform its logical evaluation function. As long as at least one of the input A and the input B is low or null, the network 210 is in a high-impedance state so that logical evaluation node 212 remains high and the output line 222 is low, or null. Because NFET N210 is on, once both input A and input B are asserted, logical evaluation node 212 is pulled low, causing output inverter 220 to assert, or drive high, the output line 222. The inverter 250 built from PFET P250 and NFET N250 functions to provide feedback from the output 222 to logical evaluation node 212 thereby providing storage of data until the flash input 202 resets the circuit 200.

In this example, the circuit 200 includes a high-threshold transistor P210 in a pull-up path that is part of circuitry used to reset the circuit 200. The high-threshold transistor P210 may help reduce power consumption because the high-threshold transistor P210 in the pull-up path limits current leakage for the gate when in the off state. The circuit 200 may also include a high-threshold transistor N210 in a pull-down path in some embodiments. High-threshold transistor N210 turns off the pull-down path when the gate is being reset. Various embodiments may include high-threshold transistor P210 without high-threshold transistor N210, high-threshold transistor N210 without high-threshold transistor P210, or both high-threshold transistor P210 and high-threshold transistor N210. Other embodiments may include one, two, three, four, or more high-threshold transistors in an NCL gate, which may or may not include high-threshold transistor P210 and/or high-threshold transistor N210. The high-threshold transistors may replace the standard voltage threshold transistors of the circuit 200—such as NFET N220, NFET N250, or PFET P250—or may be added to the existing FETs; for example, a high-threshold transistor may be added in the pull-up path of PFET P220. In many embodiments, self-ready flash NCL circuits may not contain high-threshold transistors.

Figure 3:
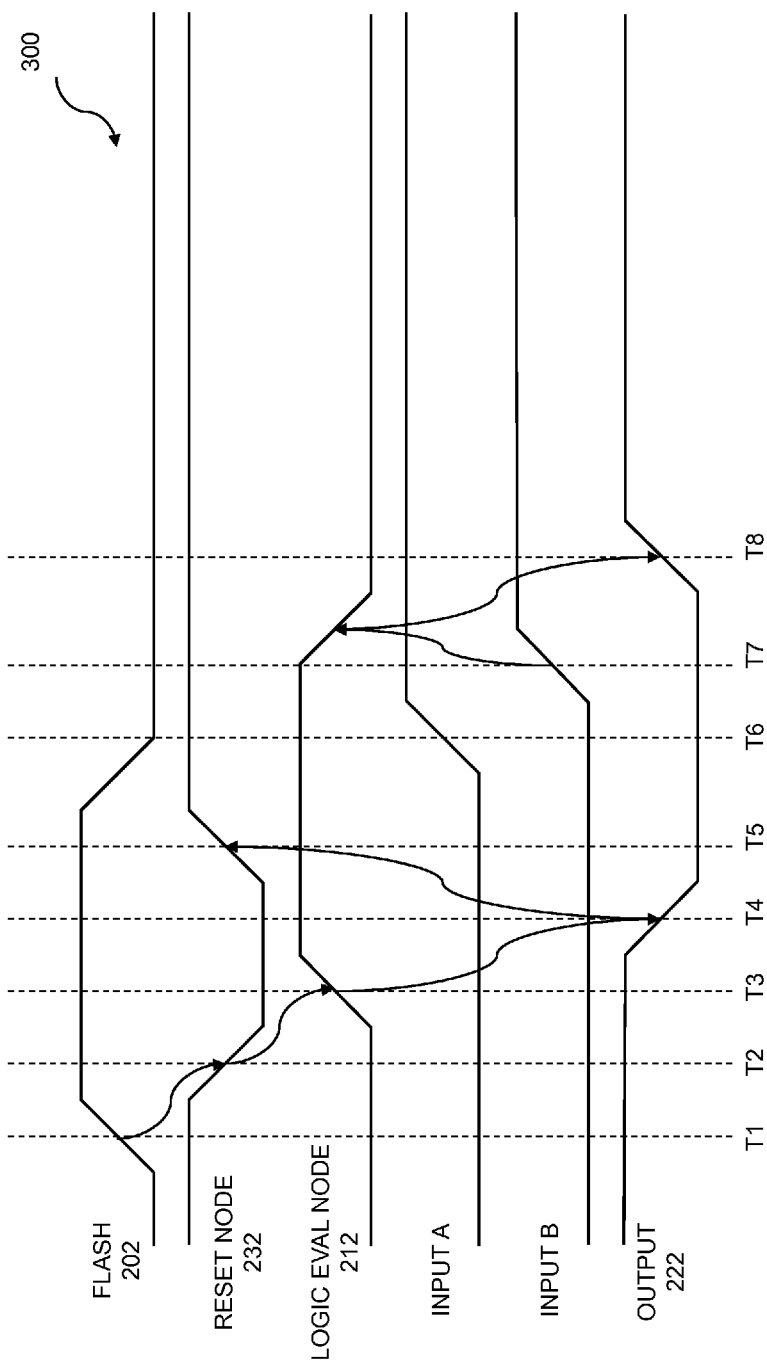
FIG. 3 is an example waveform diagram for a self-ready flash NCL circuit.

FIG. 3 is an example waveform diagram 300 for a self-ready flash NCL circuit with a one-shot circuit such as the circuit 200 shown in FIG. 2. The circuit 200 of FIG. 2 may be part of a logical pipeline where at least one gate with the one-shot circuit comprises a self-ready flash null convention logic gate. The circuit 200 of FIG. 2 has its output line 222 asserted at time T1 as the flash null line 202 is driven high. In some embodiments, the flash null line 202 may transition in the opposite direction to trigger a flash null reset, depending on the circuitry inside the self-ready flash NCL gates. The transition of the flash null line 202 from low to high causes the one-shot circuit 230 to drive the reset node 232 low at time T2. The low reset node 232 turns on PFET P210 and turns off NFET N210 so that the logical evaluation node 212 is pulled high at time T3. The logical evaluation node 212 is then inverted by the output inverter 220 so that the output line 222 goes null or low at time T4. The low output line 222 is fed to the one-shot 230 to terminate the pulse so that the reset node 232 goes high at time T5. The self-ready flash NCL circuit 300 is reset at time T5 and remains in this state until the next state changing event.

The flash null input 202 returns low sometime before the time the next flash reset pulse is needed. The input A goes high at time T6 and the input B goes high at time T7, causing the 2-of-2 pull-down network 210 to pull down the logical evaluation node 212, asserting the output line 222 at time T8. Thus, the plurality of transistors that provide for logical evaluation pull down a node within the gate and cause the output line 222 to transition to the asserted output state.

The time delays between times T1, T2, T3, T4 and T5 are dependent on the speed of the various transistors of the circuit 200 as well as the capacitance and resistance of the various circuit elements. The timing of times T6 and T7 are determined outside of the circuit 200 by the circuits driving input A and input B. The time delay between times T7 and T8 is, again, dependent on the speed of the various transistors of the circuit 200 as well as the capacitance and resistance of the various circuit elements.

Figure 4:
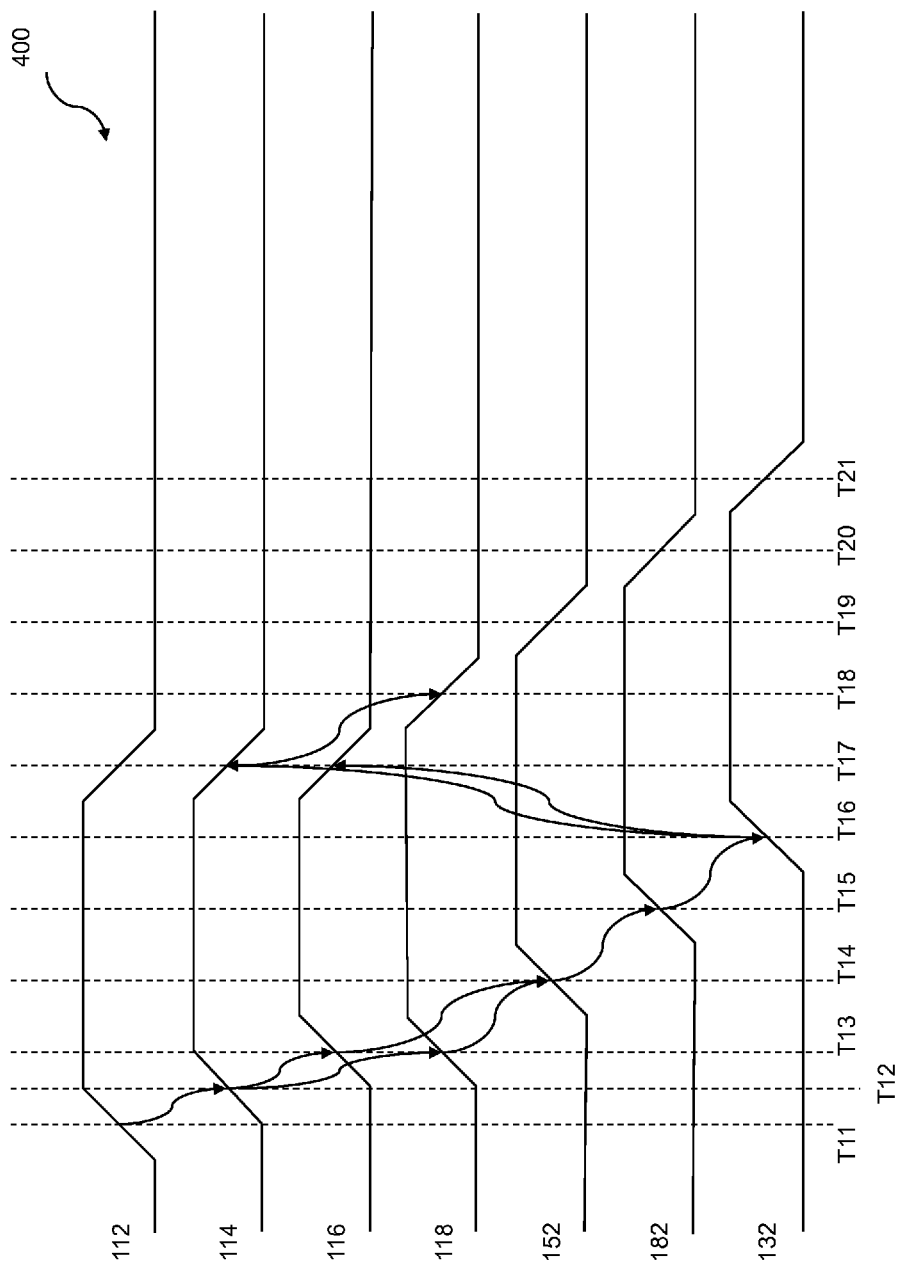
FIG. 4 is an example waveform diagram for a fast NCL data path.

FIG. 4 is an example waveform diagram for a fast NCL data path. The NCL data path 100 of FIG. 1 is part of a logical pipeline where at least one gate with the one-shot circuit comprises a self-ready flash null convention logic gate. In embodiments, other types of logic gates may be included in the pipeline that may include, but are not limited to, conventional logic, NCL gate based logic, flash NCL gate based logic, SR NCL gate based logic, and the like. The pipeline of data path 100 is comprised of gate stages separated by registration stages. To maintain the data path, there are control units including, but not limited to, flash null generation states, completion-detection circuits, and the like. A flash null generation circuit is connected to one or more outputs of the registration stage. The flash null generation circuit provides a signal that resets one or more gates from the plurality of gates. An output of a registration stage is connected to one of the plurality of input lines for one of the plurality of gates, where the output of the registration stage has two states comprising an asserted state and a null state. As the data path pipeline operates, the previous registration stage resets based on information received from the completion-detection circuit of a given stage. Outputs from the previous registration stage are set to a null state when the previous registration stage resets.

The data path 100 of FIG. 1 has intermediate data lines 112 which are outputs of the registration stage 110. The output lines 112 are asserted at time T11 as the outputs of the registration stage 110 are driven high. The data lines 112 serve as inputs to the one or more inputs of completion-detection circuit 140, which produces a completion signal for a previous stage (not shown). The signals on data lines 112 also then propagate through SR flash stages (in FIG. 1, SR flash NCL gates 120 and 122) to drive intermediate lines 114 high at time T12. Intermediate lines 114 serve as inputs to flash NCL gates 124. The output lines 116 of flash NCL gates 124 are driven high at time T13. Intermediate lines 114 may also serve as inputs to NCL gates 126. The output lines 118 of NCL gates 126 are also driven high at time T13 since the flash NCL gates 124 and NCL gates 126 may, in this example, evaluate in parallel. In practice, there may be differences in timing for the outputs of the flash NCL gates 124 and the conventional NCL gates 126 based on propagation delays, transistor characteristics, capacitive loads, and the like. Intermediate lines 116 and 118 next feed into registration stage 150, causing the outputs 152 of registration stage 150 to transition from null to asserted at time T14 if a completion signal from the next stage (not shown) is asserted. Intermediate lines 152 are fed to the inputs of the next self-ready flash NCL gates 160 and to further stages of the data path pipeline (not shown). Intermediate lines 152 are also fed to completion-detection circuit 180. In this embodiment, the completion-detection circuit 180 drives high (asserts) its output line 182 at time T15. In other embodiments, the completion-detection circuit 180 may provide an output line 182 which is active when low. The completion-detection circuit output line 182 is fed as an input to registration stage 110 and to flash generation stage 130. The flash generation stage 130 drives high a flash null line 132 at time T16. In this embodiment, the flash null line 132 is active when high, while in other embodiments the flash null line 132 may be active when low. As a result of the flash null line 132 being asserted at time T16, intermediate lines 114 and intermediate lines 116 are driven to null (reset) at time T17. The exact timing for intermediate lines 114 and intermediate lines 116 may vary due to transistor characteristics and loading specifications. Further, the null on intermediate lines 114 propagate through NCL gates 116 to drive intermediate lines 118 to null (reset) at time T18. Since intermediate lines 116 and 118 are now both reset to null, the output 152 of registration state 150 may also be driven back to null (reset) at time T19 after a follow-on completion-detection circuit (not shown) feeds back that asserted data has been captured into the next registration stage (not shown). As a result of intermediate lines 152 being driven to null, completion-detection circuit 180 may also drive its output line 182 to reset, as shown at time T20. In this example the intermediate line 152 transitions low at time T20 but in other embodiments the signal may transition high. Since completion detection signal 182 is fed back to registration state 110 and flash null generation node 130, the flash null signal 132 may also be driven low at time T21.

The time delays between times T12, T13, T14, T15, T16, T17, and T18 as shown in the figure are dependent on the speed of the various gates of the data path 100 as well as the capacitance and resistance of the various circuit elements. The timing of time T11 is determined outside of the circuit 100 by the circuits driving data into registration stage 110.

Figure 5:
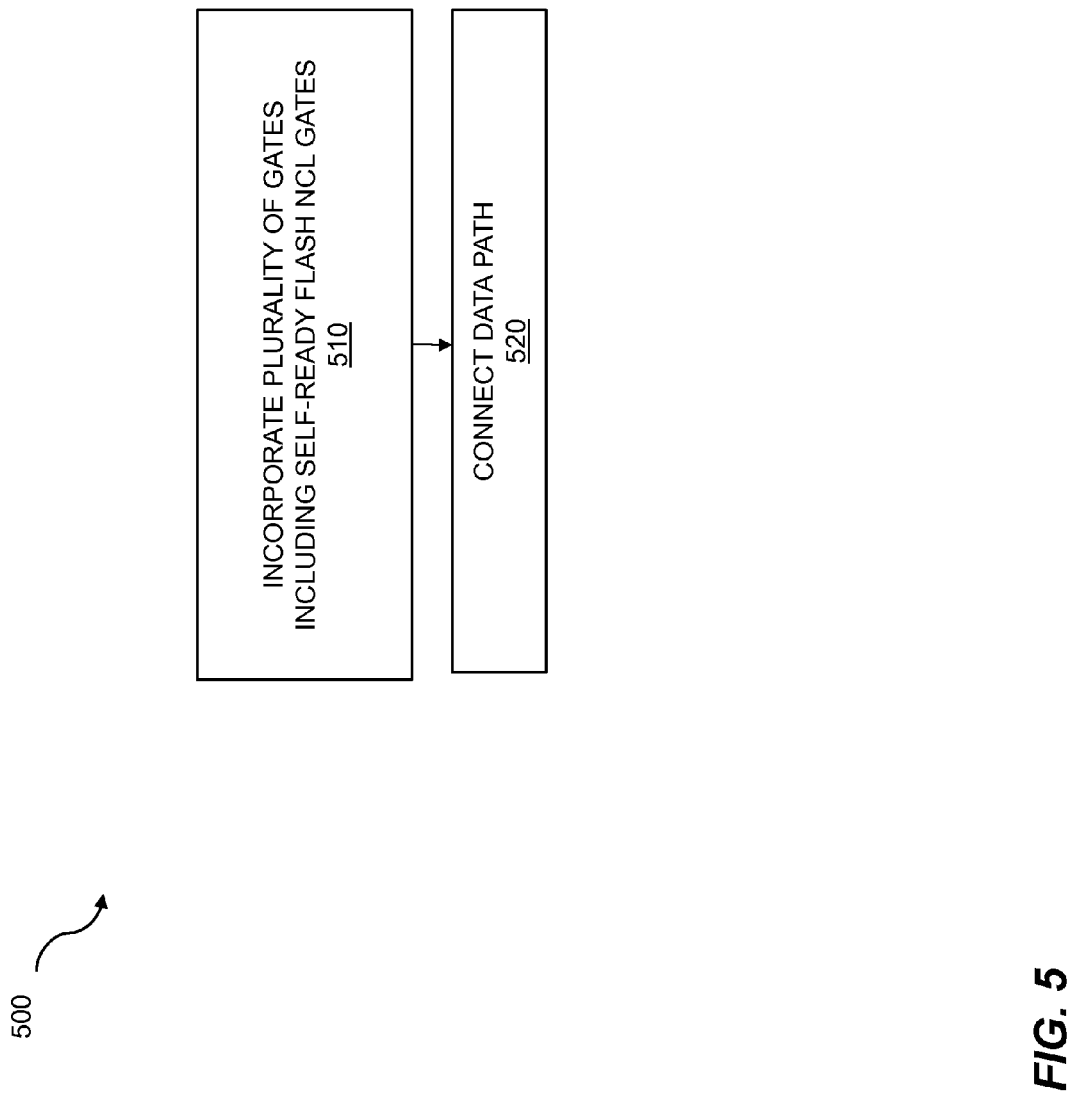
FIG. 5 is a flow diagram for implementation of a fast NCL data path.

FIG. 5 is a flow diagram for implementation a fast NCL data path. The flow 500 comprises incorporating a plurality of gates including self-ready flash NCL gates 510. This flow illustrates a method for logic implementation and may be implemented as part of an electronic design automation system. The self-ready flash NCL logic may be implemented along with other logic types. The fast NCL data path may be interspersed with other logic to accomplish the desired logic function. A mix of asynchronous and synchronous logic may be used. The fast null convention logic gate data path may comprise: a plurality of transistors wherein the plurality of transistors provide for logical evaluation; a plurality of input lines, each having an asserted state and a null state, connected to the logic gate; a flash input line, having a first state and a second state, connected to the logic gate; and an output line, having an asserted output state and a null output state, connected to the logic gate. The flow 500 continues with connecting a data path 520 formed from the plurality of gates wherein at least one gate may include a one-shot circuit where the one-shot circuit has an input attached to the flash input line and the one-shot circuit is used by the at least one gate to set the output line of the gate into the null output state. Various steps in the flow 500 may be changed in order, repeated, omitted, or the like without departing from the disclosed inventive concepts. Various embodiments of the flow 500 may be included in a computer program product embodied in a non-transitory computer readable medium that includes code executable by one or more processors.

Figure 6:
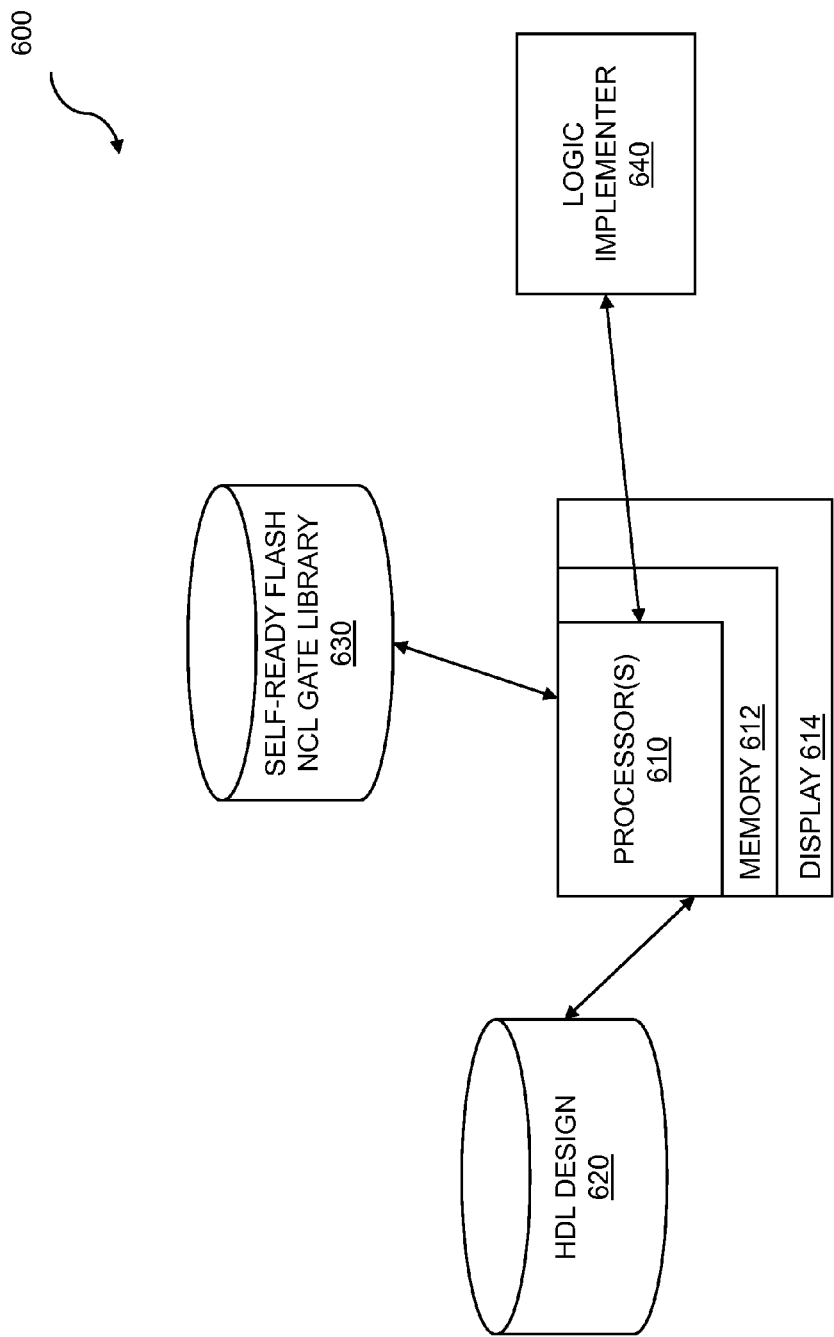
FIG. 6 is a diagram of a system for implementing a fast NCL data path.

FIG. 6 is a diagram of a system for implementing fast NCL data path. The system 600 may include one or more processors 610 and a memory 612 which stores instructions. The memory 612 is coupled to the one or more processors 610 wherein the one or more processors 610 can execute instructions stored in the memory 612. The memory 612 may be used for storing instructions, for storing circuit designs, for storing logic designs, for storing data paths, for system support, and the like.

The one or more processors 610 may read in HDL designs 620 for a given technology, data path design, and the like. The HDL design 620 may include information on standard data paths and fast NCL data paths. The one or more processors 610 may use the HDL designs 620 to implement fast NCL data path circuitry based on self-ready flash NCL gate library 630. The self-ready flash NCL gate library 630 may provide designs for data path circuits that are based on self-ready flash NCL gates. The one or more processors 610, coupled to the memory 612, may be configured to include a plurality of gates to implement various data path designs using a logic implementer 640. The logic implementer 640 may connect fast NCL data path components, and may connect to preceding or following logic. The logic implementer 640 may use VHDL™, Verilog™, or another hardware description language (HDL) as input that is used to define the desired data path. Further, the logic implementer 640 may connect the flash input line to a flash null generation circuit. Information about the various designs may be shown on a display 614 connected to the one or more processors 610. The display may comprise a television monitor, a projector, a computer monitor (including a laptop screen, a tablet screen, a net book screen, and the like), a cell phone display, a mobile device, or another electronic display. In some embodiments, the system 600 may be embodied in a client computer, a server, a cloud server, or a combination thereof. In at least one embodiment, a single computer may incorporate the components described above.

The system 600 may include computer program product embodied in a non-transitory computer readable medium comprising: code for including a plurality of gates wherein the gates are comprised of: a plurality of transistors wherein the plurality of transistors provide for logical evaluation; a plurality of input lines, each having an asserted state and a null state, connected to the gate; a flash input line, having a first state and a second state, connected to the gate; an output line, having an asserted output state and a null output state, connected to the gate; and code for connecting a data path formed from the plurality of gates wherein at least one gate includes a one-shot circuit wherein the one-shot circuit has an input attached to the flash input line and the one-shot circuit is used by the at least one gate to set the output line of the gate into the null output state. The system 600 may include a memory which stores instructions; one or more processors coupled to the memory wherein the one or more processors are configured to: include a plurality of gates wherein the gates are comprised of: a plurality of transistors wherein the plurality of transistors provide for logical evaluation; a plurality of input lines, each having an asserted state and a null state, connected to the gate; a flash input line, having a first state and a second state, connected to the gate; an output line, having an asserted output state and a null output state, connected to the gate; and connect a data path formed from the plurality of gates wherein at least one gate includes a one-shot circuit wherein the one-shot circuit has an input attached to the flash input line and the one-shot circuit is used by the at least one gate to set the output line of the gate into the null output state.

Each of the above methods may be executed on one or more processors on one or more computer systems. Embodiments may include various forms of distributed computing, client/server computing, and cloud based computing. Further, it will be understood that for each flowchart in this disclosure, the depicted steps or boxes are provided for purposes of illustration and explanation only. The steps may be modified, omitted, or re-ordered and other steps may be added without departing from the scope of this disclosure. Further, each step may contain one or more sub-steps. While the foregoing drawings and description set forth functional aspects of the disclosed systems, no particular arrangement of software and/or hardware for implementing these functional aspects should be inferred from these descriptions unless explicitly stated or otherwise clear from the context. All such arrangements of software and/or hardware are intended to fall within the scope of this disclosure.

The block diagrams and flowchart illustrations depict methods, apparatus, systems, and computer program products. Each element of the block diagrams and flowchart illustrations, as well as each respective combination of elements in the block diagrams and flowchart illustrations, illustrates a function, step or group of steps of the methods, apparatus, systems, computer program products and/or computer-implemented methods. Any and all such functions may be implemented by computer program instructions, by special-purpose hardware-based computer systems, by combinations of special purpose hardware and computer instructions, by combinations of general purpose hardware and computer instructions, by a computer system, and so on. Any and all of which implementations may be generally referred to herein as a "circuit," "module," or "system."

A programmable apparatus that executes any of the above mentioned computer program products or computer implemented methods may include one or more processors, microprocessors, microcontrollers, embedded microcontrollers, programmable digital signal processors, programmable devices, programmable gate arrays, programmable array logic, memory devices, application specific integrated circuits, or the like. Each may be suitably employed or configured to process computer program instructions, execute computer logic, store computer data, and so on.

It will be understood that a computer may include a computer program product from a computer-readable storage medium and that this medium may be internal or external, removable and replaceable, or fixed. In addition, a computer may include a Basic Input/Output System (BIOS), firmware, an operating system, a database, or the like that may include, interface with, or support the software and hardware described herein.

Embodiments of the present invention are not limited to applications involving conventional computer programs or programmable apparatus that run them. It is contemplated, for example, that embodiments of the presently claimed invention could include an optical computer, quantum computer, analog computer, or the like. A computer program may be loaded onto a computer to produce a particular machine that may perform any and all of the depicted functions. This particular machine provides a means for carrying out any and all of the depicted functions.

Any combination of one or more computer readable media may be utilized. The computer readable medium may be a non-transitory computer readable medium for storage. A computer readable storage medium may be electronic, magnetic, optical, electromagnetic, infrared, semiconductor, or any suitable combination of the foregoing. Further computer readable storage medium examples may include an electrical connection having one or more wires, a portable computer diskette, a hard disk, a random access memory (RAM), a read-only memory (ROM), an erasable programmable read-only memory (EPROM), Flash, MRAM, FeRAM, phase change memory, an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

It will be appreciated that computer program instructions may include computer executable code. A variety of languages for expressing computer program instructions may include without limitation C, C++, Java, JavaScript™, ActionScript™, assembly language, Lisp, Perl, Tcl, Python, Ruby, hardware description languages, database programming languages, functional programming languages, imperative programming languages, and so on. In embodiments, computer program instructions may be stored, compiled, or interpreted to run on a computer, a programmable data processing apparatus, a heterogeneous combination of processors or processor architectures, and so on. Without limitation, embodiments of the present invention may take the form of web-based computer software, which includes client/server software, software-as-a-service, peer-to-peer software, or the like.

In embodiments, a computer may enable execution of computer program instructions including multiple programs or threads. The multiple programs or threads may be processed more or less simultaneously to enhance utilization of the processor and to facilitate substantially simultaneous functions. By way of implementation, any and all methods, program codes, program instructions, and the like described herein may be implemented in one or more thread. Each thread may spawn other threads, which may themselves have priorities associated with them. In some embodiments, a computer may process these threads based on priority or other order.

Unless explicitly stated or otherwise clear from the context, the verbs "execute" and "process" may be used interchangeably to indicate execute, process, interpret, compile, assemble, link, load, or a combination of the foregoing. Therefore, embodiments that execute or process computer program instructions, computer-executable code, or the like may act upon the instructions or code in any and all of the ways described. Further, the method steps shown are intended to include any suitable method of causing one or more parties or entities to perform the steps. The parties performing a step, or portion of a step, need not be located within a particular geographic location or country boundary. For instance, if an entity located within the United States causes a method step, or portion thereof, to be performed outside of the United States then the method is considered to be performed in the United States by virtue of the entity causing the step to be performed.

While the invention has been disclosed in connection with preferred embodiments shown and described in detail, various modifications and improvements thereon will become apparent to those skilled in the art. Accordingly, the spirit and scope of the present invention is not to be limited by the foregoing examples, but is to be understood in the broadest sense allowable by law.

What is claimed is:

1. A logical pipeline comprising:
    a plurality of gates wherein the gates are comprised of:
        a plurality of transistors wherein the plurality of transistors provide for logical evaluation;
        a plurality of input lines, each having an asserted state and a null state, connected to one or more of the gates;
        a flash input line, having a first state and a second state, connected to one or more of the gates;
        an output line, having an asserted output state and a null output state, connected to one or more of the gates; and
    a data path formed from the plurality of gates wherein at least one gate includes a one-shot circuit wherein the one-shot circuit has an input attached to the flash input line and the one-shot circuit is used by the at least one gate to set the output line of the gate into the null output state.

2. The logical pipeline of claim 1 wherein the at least one gate with the one-shot circuit comprises a self-ready flash null convention logic gate.

3. The logical pipeline of claim 1 further comprising a registration stage that provides information to the plurality of input lines for at least one of the plurality of gates.

4. The logical pipeline of claim 3 wherein an output of the registration stage is connected to one of the plurality of input lines for one of the plurality of gates, wherein the output of the registration stage has an asserted state and a null state.

5. The logical pipeline of claim 3 further comprising a completion-detection circuit connected to a plurality of output signal lines from the registration stage.

6. The logical pipeline of claim 5 wherein an output from the completion-detection circuit is connected to a previous registration stage.

7. The logical pipeline of claim 6 wherein the previous registration stage resets based on information from the completion-detection circuit.

8. The logical pipeline of claim 7 wherein outputs from the previous registration stage are set to a null state when the previous registration stage resets.

9. The logical pipeline of claim 5 further comprising a flash null generation circuit connected to one or more outputs of the registration stage.

10. The logical pipeline of claim 9 wherein the flash null generation circuit is connected to the flash input line of a self-ready flash NCL gate.

11. The logical pipeline of claim 9 wherein the flash null generation circuit provides a signal that resets one or more gates from the plurality of gates.

12. The logical pipeline of claim 11 wherein outputs from the one or more gates are set into a null state based on signal from the flash null generation circuit.

13. The logical pipeline of claim 1 wherein the data path includes one or more gates which are reset without the use of the one-shot circuit.

14. The logical pipeline of claim 13 wherein the one or more gates which are reset without the use of the one-shot circuit are flash NCL gates.

15. The logical pipeline of claim 13 wherein the one or more gates which are reset without the use of the one-shot circuit are null convention logic gates.

16. The logical pipeline of claim 15 wherein an output from a self-ready flash NCL gate is an input to a standard NCL gate.

17. The logical pipeline of claim 15 wherein an output from a self-ready flash NCL gate is an input to a flash NCL gate.

18. The logical pipeline of claim 1 wherein the one-shot circuit is shared across multiple gates.

19. A computer implemented method for logic implementation comprising:
  incorporating a plurality of gates wherein the gates are comprised of:
    a plurality of transistors wherein the plurality of transistors provide for logical evaluation;
    a plurality of input lines, each having an asserted state and a null state, connected to one or more of the gates;
    a flash input line, having a first state and a second state, connected to one or more of the gates;
    an output line, having an asserted output state and a null output state, connected to one or more of the gates; and
  connecting a data path formed from the plurality of gates wherein at least one gate includes a one-shot circuit wherein the one-shot circuit has an input attached to the flash input line and the one-shot circuit is used by the at least one gate to set the output line of the gate into the null output state.

20. A computer system for logic implementation comprising:
  a memory which stores instructions;
  one or more processors coupled to the memory wherein the one or more processors are configured to:
    include a plurality of gates wherein the gates are comprised of:
      a plurality of transistors wherein the plurality of transistors provide for logical evaluation;
      a plurality of input lines, each having an asserted state and a null state, connected to one or more of the gates;
      a flash input line, having a first state and a second state, connected to one or more of the gates;
      an output line, having an asserted output state and a null output state, connected to one or more of the gates; and
    connect a data path formed from the plurality of gates wherein at least one gate includes a one-shot circuit wherein the one-shot circuit has an input attached to the flash input line and the one-shot circuit is used by the at least one gate to set the output line of the gate into the null output state.

* * * * *